United States Patent [19]
Lott

[11] Patent Number: 5,892,786
[45] Date of Patent: Apr. 6, 1999

[54] OUTPUT CONTROL OF VERTICAL MICROCAVITY LIGHT EMITTING DEVICE

[75] Inventor: James A. Lott, Beavercreek, Ohio

[73] Assignee: The United States of America as represented by the Secretary of the Air Force, Washington, D.C.

[21] Appl. No.: 823,410

[22] Filed: Mar. 26, 1997

[51] Int. Cl.[6] ............................................. H01S 3/19
[52] U.S. Cl. ............................ 372/50; 372/96; 372/99
[58] Field of Search ............................ 372/50, 96, 99

[56] References Cited

U.S. PATENT DOCUMENTS

| | | | |
|---|---|---|---|
| 5,136,603 | 8/1992 | Hasnain et al. | 372/50 |
| 5,216,686 | 6/1993 | Holm et al. | 372/45 |
| 5,408,486 | 4/1995 | Shoji | 372/45 |
| 5,424,559 | 6/1995 | Kasahara | 257/21 |
| 5,475,701 | 12/1995 | Hibbs et al. | 372/50 |
| 5,491,712 | 2/1996 | Lin et al. | 372/50 |
| 5,513,202 | 4/1996 | Kobayashi et al. | 372/96 |
| 5,550,850 | 8/1996 | Lee et al. | 372/16 |
| 5,568,499 | 10/1996 | Lear | 372/45 |
| 5,572,540 | 11/1996 | Cheng | 372/50 |
| 5,574,738 | 11/1996 | Morgan | 372/28 |
| 5,577,064 | 11/1996 | Swirhun et al. | 372/96 |
| 5,710,441 | 1/1998 | Ackby et al. | 372/99 X |

*Primary Examiner*—James W. Davie
*Attorney, Agent, or Firm*—Gina S. Tollefson; Thomas L. Kundert; Gerald B. Hollins

[57] ABSTRACT

An improved intracavity sensor based output power control for microcavity light emitting devices. An improved phototransistor transducer is both configured and physically disposed so that it passively transmits the spurious optical energy output of the microcavity light emitting device while simultaneously generating a light determined electrical signal of easily used large magnitude that is nearly free of error. The base-collector region of the transistor is disposed with a quantum well absorbing layer and produces a signal responsive to a selected emission wavelength. The configuration of the optical energy communicating transducer is arranged so that it is improved in sensitivity and especially in selectivity in generating the laser feedback signal.

20 Claims, 6 Drawing Sheets

OUTPUT CONTROL OF VERTICAL MICROCAVITY LIGHT EMITTING DEVICE

RIGHTS OF THE GOVERNMENT

The invention described herein may be manufactured and used by or for the Government of the United States for all governmental purposes without the payment of any royalty.

BACKGROUND OF THE INVENTION

Semiconductor microcavity detectors and light sources are essential components of emerging integrated photonic systems and micro-opto-electro-mechanical systems. The present document relates to a plurality of these semiconductor microcavity devices of both the optical energy emitting and optical energy receiving types. The vertical cavity surface emitting laser and the resonant cavity light emitting diode are two particular examples of these optical energy emitting devices and are generally referred to as microcavity light emitters in this document. The resonant cavity heterojunction phototransistor is an example of the microcavity devices which are generally referred to as microcavity detectors herein.

Vertical emitting microcavity light sources improve on many attributes of the commonly used semiconductor edge emitting lasers. Conventional edge emitting semiconductor lasers emit light in a direction parallel to the semiconductor substrate on which the lasers are formed. A vertical cavity surface emitting laser, however, has an optical cavity located perpendicular to the substrate and emits optical radiation in a direction perpendicular to the substrate. A few of the many advantages of vertical cavity surface emitting lasers include the capability of fabricating the devices at a much smaller size and that the light emitted from vertical emitting microcavity sources has a circular shape, as opposed to the oblong shape of the light from edge emitting lasers. These microcavity devices consist of a quantum well light absorbing or light gaining region, a region within an optical microcavity that is bounded by distributed Bragg reflector mirrors. Various combinations of monolithically integrated vertical cavity surface emitting lasers, resonant cavity light emitting diodes, resonant cavity PIN photodetectors, and resonant cavity heterojunction phototransistors have been fabricated. Because of the similarity of the device structures, it is in fact possible to construct several of the different device types during a single epitaxial growth sequence. To achieve this, individual devices positioned side-by-side or in a stacked configuration may be fabricated from multiple purpose vertical cavity surface emitting laser structures by subsequent selective etching, native Al-oxidation or ion implantation, and metallization steps. The devices may be interconnected functionally or functionally discrete and a functional interconnection if used may include both optical and electrical interconnection as in the present invention or any optical interconnection or any electrical interconnection. Both the vertical cavity surface emitting laser and resonant cavity light emitting diode are emerging in commercial applications. The vertical cavity surface emitting laser is more efficient than the resonant cavity light emitting diode and produces a stronger optical power output, but is generally more difficult and costly to manufacture than the resonant cavity light emitting diode.

An important requirement for optical data storage and optical communication systems, using either edge emitting lasers or microcavity light emitting devices is the dynamic stabilization of the device and its optical output power. Such stabilization is necessary to correct fluctuations due to age and changes in the environment such as from heat generated by the laser operation, or long-term drift of the laser properties. For example, conventional audio compact disk optical pick-up heads use a silicon PIN photodiode to monitor the optical power that escapes from a back facet of an edge-emitting laser diode in order to control the laser's output power level. Laser diodes used in fiber optic communication systems also use a photodetector to monitor the laser output power. For conventional edge-emitting lasers, the output power of the laser is monitored by a separate photodetector installed in the vicinity of the laser. A slightly leaky facet allows some of the emitted laser optical output power to impinge on the photodetector. The photodetector couples a signal that corresponds to the intensity of the emitted radiation to a feedback control circuit which adjusts the current driving the laser until the desired output power is achieved. In this manner, any drift of the laser intensity is detected and compensated for by adjusting the current applied to the laser.

A similar monitoring scheme for the automatic power control of vertical cavity surface emitting lasers is also known. In this approach, a PIN photodiode is grown on top of a top-emitting vertical cavity surface emitting laser in a single growth sequence. Except for the intrinsic absorbing layer and normally small free carrier losses, the PIN photodiode is transparent to the laser emission. However, a drawback of this approach is that the PIN photodiode Pinphotodiode produces a small signal that corresponds to the intensity of the laser output power plus the internally generated spontaneous emission. Consequently, the photocurrent generated by the PIN photodiode requires additional external circuitry to amplify the signal and this adds to the size and expense of a complete system. A second drawback is that a large fraction of the feedback signal is produced in response to spontaneous emission, the non-lasing light activity that occurs at all times, and this introduces error into the feedback signal. This error must be accounted and corrected for in the feedback circuit. Another drawback is that a PIN photodiode is most readily fabricated in a layer arrangement which is not easily compatible electrically with the layers needed in the relevant portion of a microcavity light emitting device- as is explained in detail subsequently herein.

In addition to the PIN photodiode monitoring of the laser output power, it is also known to fabricate a functionally independent transistor in the same layer structure used to accomplish a microcavity light emitting device. As is also explained in greater detail subsequently herein, however, there is believed to be a significant difference in both the structure and function of the power monitoring transistor arrangement of the present invention and the structure and function of functionally independent transistors. The present invention is moreover believed to involve a fundamental concept in the arrangement of any device for microcavity light emitting power control purposes which has not been appreciated heretofore.

SUMMARY OF THE INVENTION

The present invention provides improved sensor based output power control for microcavity light emitting devices. The controlled devices may include vertical cavity surface emitting lasers and resonant cavity light emitting diodes. According to the present invention, an improved phototransducer is both configured and physically disposed so that it passively transmits nearly all of the optical energy output of the microcavity light emitting device while simultaneously generating a light determined electrical signal of easily used large magnitude that is virtually free of error. The configuration of the optical energy communicating transducer is arranged so that it is improved in sensitivity and especially in selectivity in generating the laser feedback signal.

It is therefore an object of the present invention to provide power output control for microcavity light emitting devices.

It is another object of the invention to provide power output control for microcavity light emitting devices in a manner that minimizes degradation of the optical output signal.

It is another object of the invention to provide power output control for microcavity light emitting devices usable in most conventional microcavity systems.

It is another object of the invention to provide power output control for microcavity light emitting devices without the need for low level current amplification electrical circuitry.

It is another object of the invention to provide power output control of vertical cavity surface emitting lasers using improved heterojunction phototransistors monolithically integrated in said vertical cavity surface emitting laser.

It is another object of the invention to provide power output control of a vertical cavity surface emitting lasers using improved PIN photodiodes monolithically integrated in said vertical cavity surface emitting laser.

It is another object of the invention to provide power output control of a vertical cavity surface emitting laser using a controlling heterojunction phototransistor whose reception wavelength is selective and coincident with the peak wavelength of the quantum well of the vertical cavity surface emitting laser.

It is another object of the invention to provide power output control of a vertical cavity surface emitting laser using a controlling PIN photodiode whose reception wavelength is selective and coincident with the peak wavelength of the quantum well of the vertical cavity surface emitting laser.

It is another object of the invention to provide power output control of a resonant cavity light emitting diode using a controlling heterojunction phototransistor whose reception wavelength is selective and coincident with the peak wavelength of the quantum well of the vertical cavity surface emitting laser.

It is another object of the invention to provide power output control of a resonant cavity light emitting diode using a controlling PIN photodiode whose reception wavelength is selective and coincident with the peak wavelength of the quantum well of the vertical cavity surface emitting laser.

It is another object of the invention to provide an optical energy to electrical energy transducer device in which the signal enhancing benefits of transistor action signal strength multiplication, sharp spectral sensitivity reception of an input signal and optimum utilization of a node and anti-node signal collection arrangement are combined into the transducer for enhanced sensitivity characteristics.

It is another object of the invention to provide an optical energy to electrical energy transducer device for controlling output of said optical energy with improved accuracy by minimizing sensing of selected spontaneous emissions.

Additional objects and features of the invention will be understood from the following description and claims and the accompanying drawings.

These and other objects of the invention are achieved by a microcavity light emitting semiconductor device with integrated output control comprising:

an optical cavity active region having a first quantum well for emitting light of a preselected wavelength $\lambda$, said optical cavity active region formed between an n-doped area, and a p-doped area, dimensional thickness of said optical cavity active region corresponding to an integer multiple of $\lambda/2$ and dimensional thickness of said first quantum well being less than 300 Å;

said n-doped area comprising a first reflector mirror and said p-doped area comprising a second reflector mirror, said first and second reflector mirrors having a higher bandgap than said quantum well to prevent light absorption therein at the preselected wavelength $\lambda$;

a light sensing device embedded in said first reflector mirror; and a second quantum well connected to said light sensing device causing said light sensing device to selectively absorb light at said preselected wavelength $\lambda$;

said light sensing device producing an electrical output signal proportional to output of said optical cavity active region and wherein said electrical output signal is readily usable in a feedback circuit.

BRIEF DESCRIPTION OF THE DRAWINGS

FIG. 2b shows an equivalent circuit diagram of the device of FIG. 2a.

DETAILED DESCRIPTION

Figures 1A, 1B:
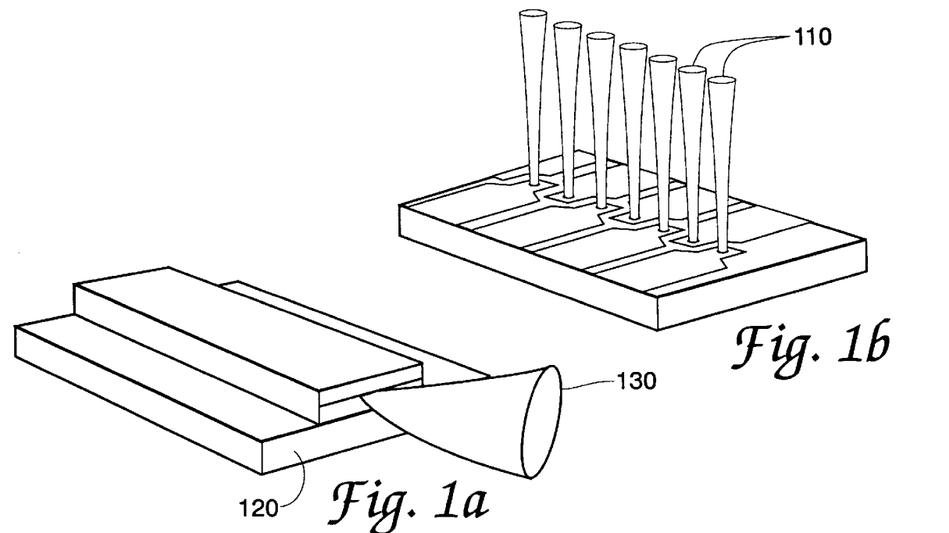
FIG. 1a shows an edge emitting laser diode and its output.
FIG. 1b shows a vertical cavity surface emitting laser array and its output.
Figure 2A:
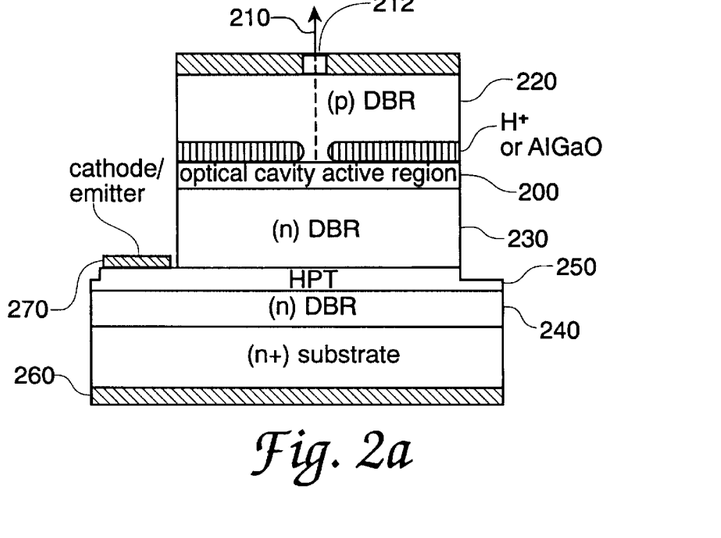
FIG. 2a shows a surface emitting laser diode with an npn heterojunction phototransistor in accordance with the present invention.
Figure 2B:
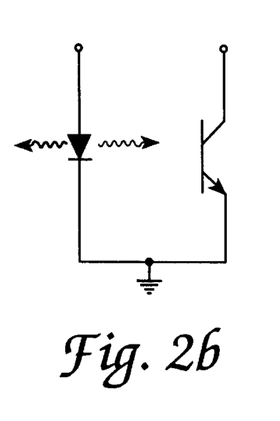

A microcavity light emitting device consists of an optical cavity active region which terminates at each end in a reflective mirror, usually a distributed Bragg reflector mirror which is preferably made of semiconductor material for purposes of the present invention. FIG. 2 in the drawings represents a microcavity light emitting device of this type. A distributed Bragg reflector mirror made from p type semiconductor material is shown at 220 in FIG. 2, above the light emitting device active region or active optical cavity 200 and an n type distributed Bragg reflector mirror is shown below the active region 200 at 230. The optical cavity active region 200 is where the light of a microcavity light emitting device is generated. This light exits the FIG. 2 structure by way of the aperture 212 in the device layers adjacent the reflector layer 220. The generated light or optical energy in a FIG. 2 type of device is generated in one or more quantum wells located within the active region 200 and is emitted in an upward direction in FIG. 2, in a direction perpendicular to the substrate as shown at 110 in FIG. 1 and at 210 in the cross-sectional view in FIG. 2. This is in contrast to semiconductor edge emitting lasers as shown in FIG. 1a where light 130 is emitted in a direction parallel to the semiconductor substrate 120.

Figure 13:
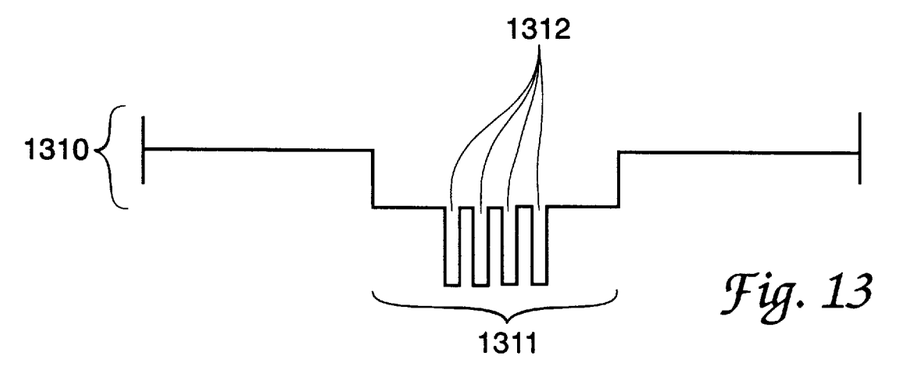
FIG. 13 shows a cross-sectional view of an optical cavity active region containing four quantum wells.

A semiconductor quantum well is a thin, smaller bandgap material surrounded by larger bandgap material layers. For present purposes a quantum well has a dimensional thickness of about 300 A or less and is preferably in the range of 40–100 A. Material of the quantum well and surrounding layers are first selected followed by determinations of the thickness of the same layers. These features of the quantum well active region are selected based on the desired emitting or absorbing optical wavelength $\lambda$. After the features of the quantum well active region are selected, the material type, thickness and doping of the layers surrounding the quantum well are selected. All together, these layers form the optical cavity active region at 200 in FIG. 2a. An optical cavity active region containing quantum wells is shown in FIG. 13. An optical cavity active region at 1311 in FIG. 13 generally contains one or more quantum wells. Four quantum wells are shown at 1312 in FIG. 13. The material surrounding the quantum well is selected such that the quantum well is accurately positioned at a standing wave peak, and in the case of an emitting quantum well, the surrounding layers are selected so that the optical cavity active region shown at 1310 in FIG. 13 resonates at the emitted wavelength $\lambda$. Given a desired emission wavelength lambda ($\lambda$), the optical cavity active region 200 is provided with an overall thickness dimension which corresponds to an integral multiple of $\lambda/2$ ($\lambda/2$, $1\lambda$, $1.5\lambda$, $2\lambda$, $2.5\lambda$, etc.) wavelengths of the desired output optical energy. The smallest optical thicknesses of $\lambda/2$ or $1\lambda$ are generally used.

The physical thickness of the active region 200 when expressed in terms of refraction properties of semiconductor materials is $d=u\lambda/2n$, where n is the index of refraction of the semiconductor material and u is a positive integer 1,2,3. . . . As this wavelength-related discussion implies the frequency or spectral "color" of the emitted light or optical energy is determined by resonance conditions within the structure composed of the layers 200, and the distributed Bragg reflector layers 220 and 230. These concepts relating to a microcavity light emitting device are generally known and considered to be fundamentals of the microcavity light emitting device art. Additional discussion of this type is, for example, to be found in the U.S. Pat. No. 5,577,064 of S. E. Swirhum et al.; U.S. Pat. No. 5,216,686 of P. M. Holm et al.; U.S. Pat. No. 5,136,603 of G. Hasnain et al.; and U.S. Pat. No. 5,132,982 of W. K. Chan et al. which are elsewhere identified in connection with the record of the present invention. The contents of these patents is hereby incorporated by reference herein.

The FIG. 2 structure is therefore designed to emit light at a certain wavelength. The emission wavelength is changed by changing the compositions or thickness of some or all of the layers used at 200, 220, 230, 240 and 250 in FIG. 2. For state-of-the-art devices, the emission wavelength can be in the infrared (700–1500 nm or longer), or in the visible (400–700 nm) spectral ranges, for example. Newer materials are expected to extend the possible emission range into the ultraviolet (shorter than 400 nm) and deeper into the infrared (longer than 1500 nm) regions. A typical infrared or visible light emitting structure consists of an optical cavity active region shown at 200 in FIG. 2, for example, comprised of an AlGaAs (aluminum gallium arsenide) or AlGaInP (aluminum gallium indium phosphide) quantum well active region. A preferred arrangement of the present invention includes an optical cavity active region consisting of from one to four $Al_{0.11}Ga_{0.89}As$ quantum wells, each about 8 nm-thick, surrounded by $Al_xGa_{1-x}As$ barrier layers where $0.3 \leq x \leq 0.6$. Surrounding the barrier layers are $Al_xGa_{1-x}As$ layers. The thickness of these layers is chosen such that the total optical thickness of the optical cavity active region is $\lambda$. These layers may also be compositionally graded. The design of active regions is well known by those skilled in the semiconductor optical device art.

The optical cavity active region at 200 in FIG. 2 is bounded on two sides by reflective mirrors, preferably distributed Bragg reflector mirrors at 220 and 230. One of the distributed Bragg reflector mirrors surrounding the optical cavity active region is first grown epitaxially on a semiconductor substrate using any one of several known techniques such as Molecular Beam Epitaxy or Metal Organic Vapor Phase Epitaxy. The distributed Bragg reflector mirrors at 220 and 230 consist of several periods of $\lambda/4$ layers called quarter-wave layers. One distributed Bragg reflector mirror period is two quarter-wave layers. The quarter-wave layers have an index of refraction that is relatively a "high" or a "low". A high index of refraction is typically between 3.2–3.8 while a low index of refraction is typically 2.9–3.4. Alternating pairs of high and low index layers constitute one period. The distributed Bragg reflector mirror layers at 220 and 230 have a higher energy bandgap than the quantum well layers at 200 so they will not absorb at the wavelength $\lambda$. Absorption in these layers reduces the efficiency of the device, and may cause it not to function. The reflectance of the distributed Bragg reflector mirror, at the Bragg design wavelength $\lambda$, increases as the number of mirror periods increases. The vertical cavity surface emitting laser distributed Bragg reflector mirrors have a reflectance of typically 99.9% or higher (i.e. approximately 100%) on the non-emitting side, the side through which optical energy is reflected at 230 and 240 in FIG. 2, for example, and typically 99% or higher on the emitting side, the side through which optical energy is emitted at 220 in FIG. 2, for example. Resonant cavity light emitting diode distributed Bragg reflector mirrors have reflectances of typically 30 to 90% on the emitting side, and typically 70 to 99.99% on the non-emitting side.

A preferred arrangement of the invention includes distributed Bragg reflector mirrors at 220, 230 and 240 in FIG. 2, for example, consisting of alternating quarter-wave layers of $Al_{0.9}Ga_{0.1}As$ (low index) and $Al_{0.3}Ga_{0.7}As$ (high index). The distributed Bragg reflector mirrors are most often AlGaAs for emission wavelengths 600–1500 nm. Mirrors for short blue-green, blue, and ultraviolet emission have been demonstrated with ZnSe (zinc selenide) and AlGaInN (aluminum gallium indium nitride). The composition and thickness of the distributed Bragg reflector mirrors is selected to achieve a desired resonant wavelength λ. As is known by those skilled in the state of the art, the interfaces between the distributed Bragg reflector mirror layers are compositionally graded to reduce the series resistance which degrades performance. The low index distributed Bragg reflector mirror layers surrounding the optical cavity are preferably composed of $Al_xGa_{1-x}As$ with $0.94 \leq x \leq 0.98$. During device fabrication, these layers are oxidized to form native aluminum gallium-oxide (AlGa—O) layers. The AlGa—O layers do not conduct electrically. They are used to form a current aperture. Current that is injected from the metal contacts, through the p and n distributed Bragg reflector mirror regions, is forced to flow through the open, unoxidized area defined by the AlGa—O layers. A current aperture may also be formed by proton implantation; however, the use of native AlGa—O layers is the preferred method.

Figure 4:
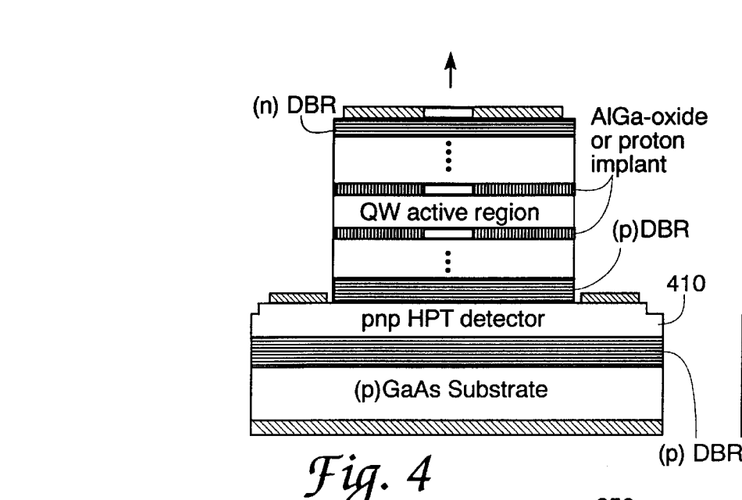
FIG. 4 shows a vertical cavity surface emitting laser or resonant cavity light emitting diode with a pnp heterojunction phototransistor detector embedded in a bottom mirror in accordance with the present invention.
Figure 5:
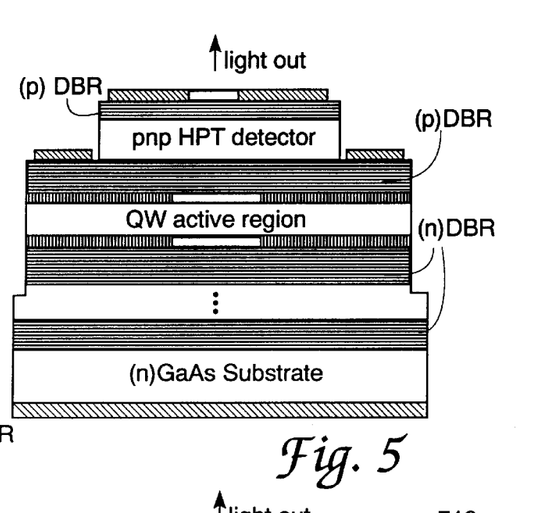
FIG. 5 shows a vertical cavity surface emitting laser or resonant cavity light emitting diode with a pnp heterojunction phototransistor detector embedded in a top mirror in accordance with the present invention.
Figure 6:
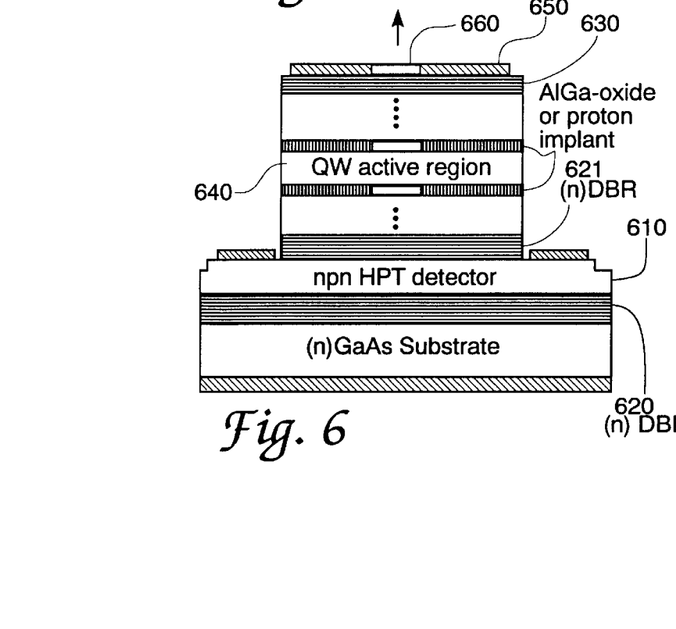
FIG. 6 shows a vertical cavity surface emitting laser or a resonant cavity light emitting diode with an npn heterojunction phototransistor detector embedded in a bottom mirror in accordance with the present invention.
Figure 7:
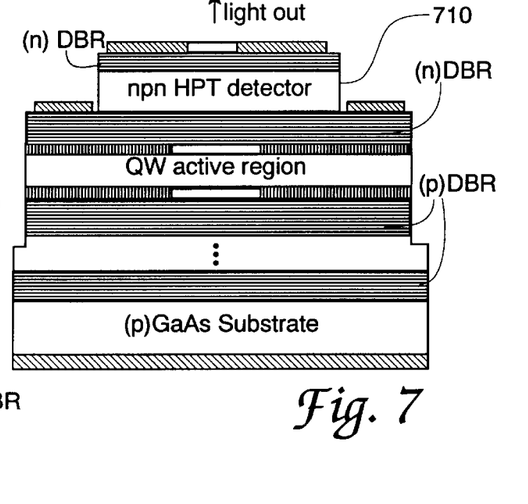
FIG. 7 shows a resonant cavity light emitting diode or a vertical cavity surface emitting laser with a npn heterojunction phototransistor detector embedded in a top mirror in accordance with the present invention.

FIG. 6 shows a vertical cavity surface emitting laser or resonant cavity light emitting diode with an npn heterojunction phototransistor detector 610 in a lower mirror and FIG. 7 shows a resonant cavity light emitting diode or a vertical cavity surface emitting laser with an npn heterojunction phototransistor detector 710 in an upper mirror. An npn heterojunction phototransistor comprises a plurality of semiconductor layers which in the present invention also form a portion of the n-doped distributed Bragg reflector mirror. Each of the layers that form a heterojunction phototransistor in the present invention therefore includes at least one of the layers of the mirror in which it is embedded. A pnp heterojunction phototransistor comprises a plurality of semiconductor layers which form a portion of the p-doped distributed Bragg reflector mirror at 410 in FIG. 4. The heterojunction phototransistor acts as part of the distributed Bragg reflector mirror layer. Referring again to FIG. 6, the n type distributed Bragg reflector mirror which forms part of the heterojunction phototransistor is located at 620. Optical light is emitted through the metal contact layer aperture at 660. The heterojunction phototransistors 610 and 710 include a quantum well layer having an energy band gap equal to or smaller than the band gap corresponding to the optical radiation, so that the heterojunction phototransistor structure intercepts and absorbs a portion of the optical radiation and generates a corresponding electrical signal.

Figure 12:
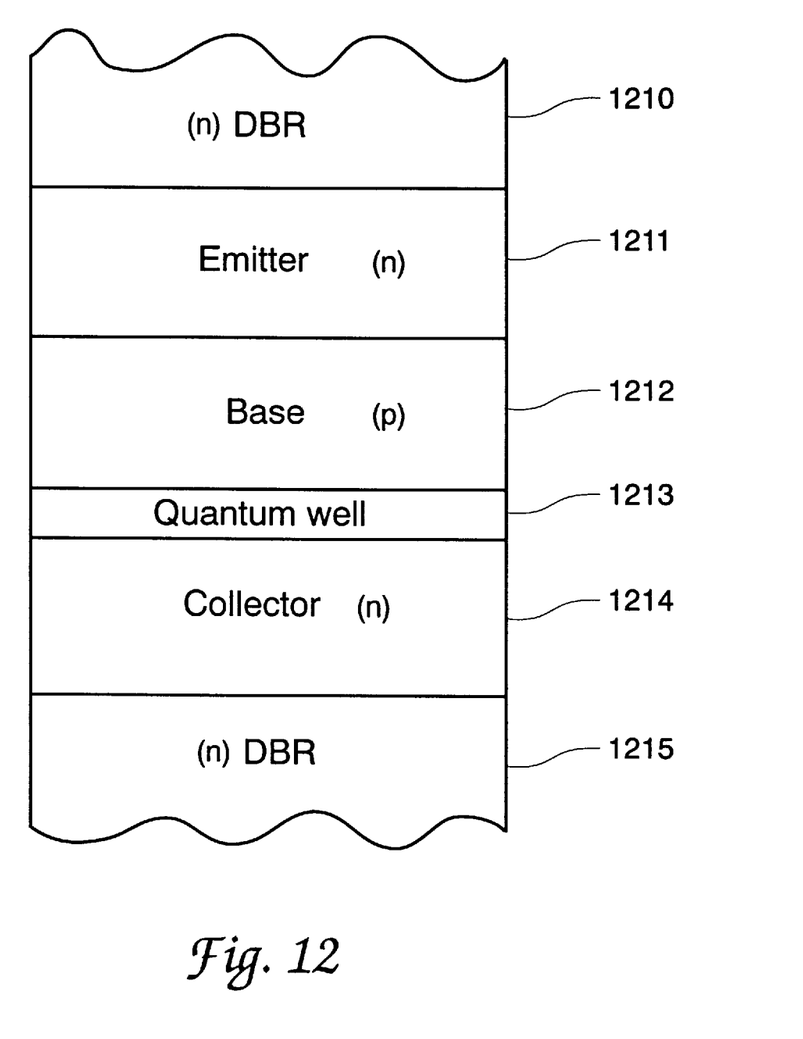
FIG. 12 shows a cross-sectional view of a phototransistor embedded in a distributed Bragg reflector mirror in accordance with the present invention.

FIG. 12 shows a cross-sectional view of an npn heterojunction phototransistor detector in accordance with the present invention. The phototransistor comprises a base layer 1212, an emitter layer 1211 and a collector layer 1214. The phototransistor as shown is embedded in an n doped distributed Bragg reflector mirror pair shown at 1210 and 1215. The emitter 1211 and collector 1214 layers of an npn phototransistor are n doped and the base 1212 layer is p doped. In a pnp phototransistor, the base is n doped and the emitter and collector are p doped. In accordance with the present invention, a quantum well 1213 is located at or near the junction of the base layer 1212 and the collector layer 1214 of the phototransistor. This quantum well may be identical to the light emitting quantum well(s) in the active region as shown at 200 in FIG. 2, or it may be composed of a material with a smaller energy band gap to increase absorption. Locating the quantum well 1213 in FIG. 12 at or near the base collector junction of the phototransistor helps to maximize the absorption efficiency of the phototransistors. The absorbing layers are placed at standing wave peaks. Use of an absorbing quantum well at this location, as opposed to merely a thicker absorbing layer, provides highly selective energy absorption at the wavelength emitted by the microcavity light emitting device and suppresses the amount of absorption at other wavelengths.

Figure 3:
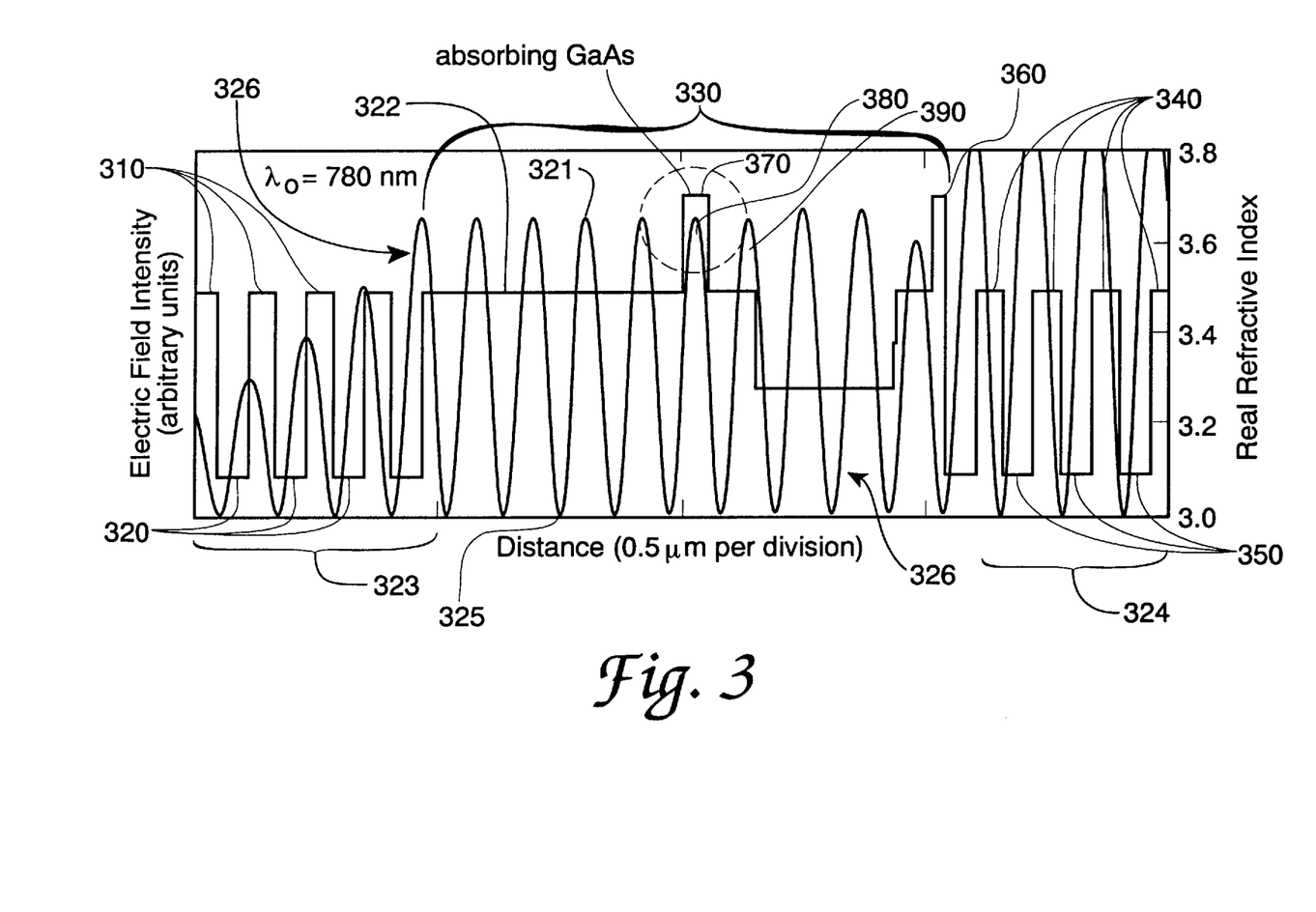
FIG. 3 shows an electric field intensity standing wave pattern and refractive index profile in accordance with the present invention.

The desired placement of the phototransistor or other transducer device according to the present invention with respect to a light source is further illustrated in the graph of FIG. 3. The left y-axis of this graph represents electric field intensity and the x axis of the graph represents distance. The straight line 322 on the FIG. 3 graph represents changes in the refractive index—i.e. a refractive index profile of the device. The wavy line 326 in FIG. 3 represents the standing wave electric field intensity of the device or $|E|^2$ where E is electric field magnitude. The entire refractive index of the phototransistor is represented at 330 with the base-emitter junction region represented at 370. Quarter wave thick layers of the distributed Bragg reflector mirror are represented at 323 and 324 in FIG. 3 with high indices of refraction layers being represented at both 310 and 340 while quarter wave layers with low indices of refraction are represented at both 320 and 350. The standing wave 326 comprises peaks and valleys with 325 indicating a valley and 321 indicating a peak. As indicated in FIG. 3 the electric field intensity is generally increasing from left to right in the drawing and in fact goes off the scale at the right-hand end of the drawing. This off-scale indication is not significant except to indicate large magnitude. In the present invention an antinode or peak of the standing wave electric field intensity 326 is desirably at the location 370 of the base emitter junction in the FIG. 3 graph. More precisely, it is desired that a peak 380 of the electric field intensity be accurately coincident with the location of the quantum well layer within the collector region of the transistor near or at the collector-base junction. This coincidence between electric field intensity and quantum well layer location in the light absorbing device is considered to be one of several significant aspects of the present invention since such coincidence is found to improve transducer light to electrical signal performance by providing for maximum absorption at wavelength λ, while absorbing less efficiently at other wavelengths. Known systems do not teach selective absorption of light at the selected wavelength λ as does the present invention.

FIG. 3 has therefore disclosed significant aspects of the present invention, the incorporation of a spectrally selective quantum well layer into the base-collector region of a feedback signal generating phototransistor light to electrical signal transducer device and the arrangement of a physical coincidence between transistor internal electric field intensity and the location of this quantum well layer. These aspects are believed also relevant to transducer devices other than a phototransistor, a device such as a PIN photodiode for example. When such a PIN photodiode is used as the transducer device, it is desirable that the quantum well layer be located within the undoped intrinsic layer and that the electric field intensity waveform 326 be again disposed to provide the antinode and quantum well layer coincidence which is indicated in FIG. 3.

Such a PIN photodiode transducer arrangement of the invention does not achieve the advantages of another significant aspect of the thus far described transducer; that is, it lacks the signal gain characteristics achieved by transistor action in the base-collector of the phototransistor. The improved spectral selectivity and gain achieved with the addition of a quantum well layer to such a PIN photodiode is nevertheless believed to make this device a viable transducer for some uses of the invention.

Figure 11:
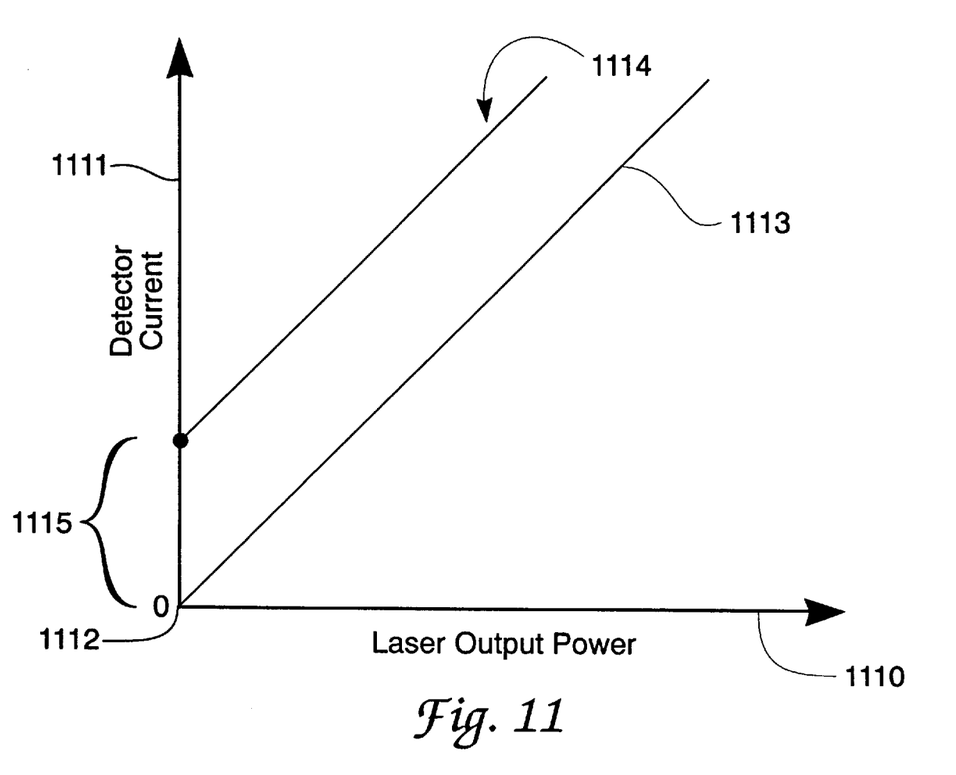
FIG. 11 shows a graph illustrating the relationship between laser power output and detector photocurrent provided by differing integrated detector transducer arrangements.

FIG. 11 is a graph further illustrating the selective absorption feature of the present invention. The y-axis 1111 in FIG. 11 represents detector photocurrent. In the transistor embodiment of the present invention, the detector current is a collector current of a phototransistor which is proportional to the base current of the phototransistor which is dependent upon absorbed optical energy. The x axis 1110 in FIG. 11 represents emitted optical energy, ie. laser output power in the case of a vertical cavity surface emitting laser. An output power control device or transducer that is free of error should produce a relationship as represented by the line of 1113 in FIG. 11 where the detector current is zero when the laser output power is zero. However, most known transducer devices produce an output similar to the relationship represented by the line of 1114 where a detector current is generated even when laser output power is zero. Such known devices are absorbing a sample of spontaneous emissions produced by the microcavity light emitting device prior to the bias point at which lasing occurs in the device and are thereby generating a detector current proportional to this spontaneous emission. The detector current associated with spontaneous emissions for line 1114 is shown at 1115. Such error must be accounted for in feedback circuits employing such known devices. By contrast, the present invention minimizes such error. The quantum well employed in accordance with the present invention causes selective absorption only at the desired laser wavelength $\lambda$ and minimizes absorption at all other wavelengths, including those of spontaneous emission. Accordingly, the optical energy control device of the present invention produces a relationship between detector current and laser output power closely resembling the line of 1113. Error due to current associated with spontaneous emission is much smaller providing much greater accuracy over other known transducer devices.

Figures 8, 9, 10:
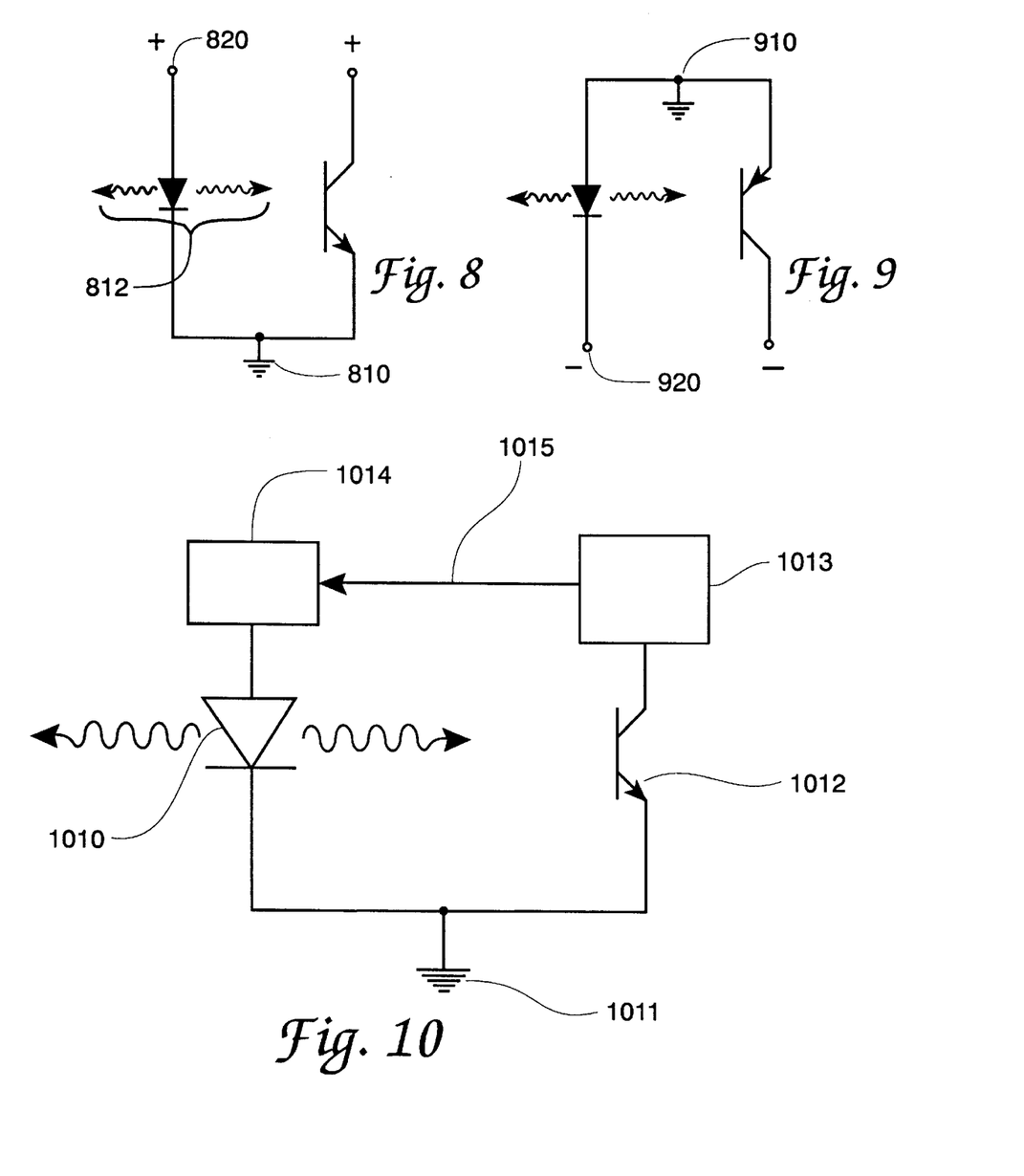
FIG. 8 shows an equivalent circuit diagram of the vertical cavity surface emitting laser and the resonant cavity light emitting diode and heterojunction phototransistor of FIGS. 6 and 7.
FIG. 9 shows an equivalent circuit diagram of the vertical cavity surface emitting laser and resonant cavity light emitting diode and heterojunction phototransistor of FIGS. 4 and 5.
FIG. 10 shows a control and feedback circuit in accordance with the present invention.

FIG. 8 is an electrical circuit diagram of an npn heterojunction phototransistor and microcavity light emitting device in accordance with the present invention. The symbol shown at 812 in FIG. 8 is a forward biased diode and radiation therefrom is used herein to represent both the vertical cavity surface emitting laser and the resonant cavity light emitting diode devices. As indicated in FIGS. 8 and 9, one electrical node of the light emitting device and one electrical node of the output monitoring transistor device are electrically joined together—a fact which is electrically convenient for or results from the several common layer arrangements between these devices as employed in the present invention. An npn heterojunction phototransistor is a preferred arrangement over a pnp heterojunction phototransistor for the transistor transducer configuration of the invention because the common contact between laser diode and npn heterojunction phototransistor can be placed at the negative electrical node or ground potential 810. This can be seen by considering FIGS. 8 and 9. Comparison of these two circuit diagrams shows that in an npn heterojunction phototransistor, the negative contact 810 is at ground and a positive voltage can be applied to the positive contact 820 to generate light in the device. Alternatively, in the circuit diagram of the pnp heterojunction phototransistor of FIG. 9, the positive contact is at ground 910 so negative voltage must be applied at the negative contact 920 to generate light in the device. This is undesirable from a practical standpoint because the convention used in most existing systems is to apply light generating voltage at a positive contact. Accordingly, pnp heterojunction phototransistors would not be readily insertable in many existing systems whereas a npn heterojunction phototransistor would be readily insertable.

A feedback circuit for use with the present invention is shown in FIG. 10. In this circuit, the energy source 1014 used for activating the light generated in the laser diode 1010 sends a current whose output is proportional to the input from the energy source to the laser diode. The phototransistor 1012 senses the light output from the laser diode 1010. In the phototransistor, the base photocurrent controls the collector current, or in other words, the collector current is proportional to the base photocurrent. In a phototransistor, there is no base contact. The collector current from the phototransistor is sent to the feedback circuit 1013 which uses the collector current to generate a feedback signal for the energy source 1014. The energy source 1014 adjusts for any deviation in laser output power. The adjusted energy source in turn provides a corrected energy supply to the laser diode to produce the desired output. This maintains the output of the laser diode at a constant desired level. A similar circuit to FIG. 10 may be used with resonant cavity light emitting diode sources. A similar circuit to FIG. 10 with perhaps added gain in an instrumentation amplifier may be used with the PIN photodiode or other lower output level transducer device.

The present invention therefore provides more accurate control of the output power of a microcavity light emitting device through the use of an unusual feedback transducer device and is believed to be a significant improvement over other known methods and structures. The unified structure employed consists of a microcavity light-emitting device and an embedded heterojunction phototransistor. The microcavity light emitting device is a vertical cavity surface emitting laser and may also be a resonant cavity light-emitting diode. The transducer samples a small fraction of optical power emitted from the light emitting device and generates a signal proportional thereto. The signal is then used in a separate feedback circuit to stabilize or control the light emitting device optical output power. The present invention is an improvement over other known devices because the amount of optical power used as a sample by the desired transducers may be much less than in other known devices. The gain action of a transistor transducer employs a sample of optical light emitted from the device of a low magnitude and produces an electrical signal of proportionally much higher magnitude. By using only a small sample of optical energy, the invention minimizes the fraction of internally absorbed optical power and therefore results in a higher device efficiency. The received optical signal that is proportional to the output power of the device is amplified due to the phototransistor action thereby reducing the need for outside amplification in the feedback circuitry. A phototransistor for microcavity light emitting devices or other devices output power control according to the invention can be immediately employed in most conventional systems.

While the apparatus and method described herein constitutes a preferred embodiment of the invention, it is to be understood that the invention is not limited to this precise form of apparatus or method and that changes may be made therein without departing from the scope of the invention which is defined in the appended claims.

I claim:

1. A microcavity light emitting semiconductor device system with integrated output sensing comprising:

an optical cavity active region having a first quantum well for emitting light of a preselected wavelength $\lambda$, said optical cavity active region being formed between an n-doped area, and a p-doped area, dimensional thickness of said optical cavity active region corresponding to an integer multiple of $\lambda/2$;

said n-doped area comprising a first optical reflector mirror and said p-doped area comprising a second optical reflector mirror, material of said first and second reflector mirrors having a higher band gap than that of said quantum well to prevent light absorption therein at preselected wavelength $\lambda$;

a resonant light sensing device embedded in one of said mirrors; and a second quantum well located within said light sensing device at a position giving optimal spectral responsivity at wavelength $\lambda$.

2. The microcavity light emitting semiconductor device system of claim 1, further including a feedback circuit comprising:

an energy source for activating light generation in said optical cavity active region;

a laser diode structure received in said optical cavity active region and generating light proportional to input from said energy source;

a feedback loop including a phototransistor embodiment of said light sensing device sensing output of said laser diode; and an amplifier connected in said feedback loop to compare said laser diode output with a preselected reference value.

3. The microcavity light emitting semiconductor device of claim 1, wherein dimensional thickness of said quantum well being less than 300 A.

4. The microcavity light emitting semiconductor device of claim 1, wherein said microcavity light emitting semiconductor device comprises a vertical cavity surface emitting laser.

5. The microcavity light emitting semiconductor device of claim 1, wherein said microcavity light emitting semiconductor device comprises a resonant cavity light emitting diode.

6. The microcavity light emitting semiconductor device of claim 1, wherein said light sensing device is a PIN photodiode.

7. The microcavity light emitting semiconductor device of claim 1, wherein said light sensing device is an npn heterojunction phototransistor.

8. The microcavity light emitting semiconductor device of claim 1, wherein said light sensing device is a pnp heterojunction phototransistor.

9. A microcavity light emitting semiconductor device system with integrated heterojunction phototransistor output sensing comprising:

a preselected wavelength $\lambda$ light emitting optical cavity active region having a first quantum well area, said optical cavity active region being formed between an n-doped semiconductor area, and a p-doped semiconductor area, thickness of said optical cavity active region being an integer multiple of $\lambda/2$;

said n-doped semiconductor area comprising a first reflector mirror and said p-doped semiconductor area comprising a second reflector mirror, said first and second reflector mirrors being comprised of semiconductor material having a higher band gap than said quantum well active region semiconductor material and characterized by minimal light absorption therein at wavelength $\lambda$;

an npn heterojunction phototransistor embedded in said first reflector mirror, said transistor having a base region, an emitter region and a collector region; and a spurious light emission-rejecting second quantum well placed at said base-collector region of said npn heterojunction phototransistor and causing selective absorption therein at said preselected wavelength $\lambda$;

whereby said heterojunction phototransistor produces a collector current proportional to output of said optical cavity active region and wherein said collector current is readily usable in a feedback circuit.

10. The microcavity light emitting semiconductor device system of claim 9, further including:

an energy source activating light generation in said optical cavity active region;

a laser diode structure in said optical cavity active region and generating light proportional to input from said energy source;

a feedback loop including said phototransistor; and an amplifier connected to said feedback loop to compare said laser diode output is compared to a reference value.

11. The microcavity light emitting semiconductor device of claim 9, wherein said first and second reflecting mirrors comprise distributed Bragg reflector mirrors having a plurality of semiconductor layers of alternating high and low indices of refraction, each layer being of a thickness of $\lambda/4$.

12. The microcavity light emitting semiconductor device of claim 9, wherein said semiconductor layers of low indices of refraction consisting of $Al_{0.9}Ga_{0.1}As$ and layers of high indices of refraction consisting of $Al_{0.3}Ga_{0.7}As$.

13. The microcavity light emitting semiconductor device of claim 9, wherein said microcavity light emitting semiconductor device comprises a vertical cavity surface emitting laser.

14. The microcavity light emitting semiconductor device of claim 9, wherein said microcavity light emitting semiconductor device comprises a resonant cavity light emitting diode.

15. A microcavity light emitting semiconductor device with integrated heterojunction phototransistor output control comprising:

a preselected wavelength $\lambda$ light emitting optical cavity active region having a first quantum well area, said optical cavity active region being formed between an n-doped semiconductor area, and a p-doped semiconductor area, thickness of said optical cavity active region being an integer multiple of $\lambda/2$;

said n-doped semiconductor area comprising a first reflector mirror and said p-doped semiconductor area comprising a second reflector mirror, said first and second reflector mirrors being comprised of semiconductor material having a higher band gap than said quantum well active region semiconductor material and characterized by minimal light absorption therein at wavelength $\lambda$;

an pnp heterojunction phototransistor embedded in said second reflector mirror, said transistor having a base region, an emitter region a collector region; and a spurious light emission-rejecting second quantum well placed at said base-collector region of said pnp heterojunction phototransistor and causing selective absorption therein at said preselected wavelength $\lambda$;

whereby said heterojunction phototransistor producing a collector current proportional to output of said optical cavity active region and wherein said collector current is readily usable in a feedback circuit.

16. The microcavity light emitting semiconductor device of claim 15, said feedback circuit comprising:
   an energy source for activating light generation in said optical cavity active region;
   a laser diode for generating light proportional to input from said energy source;
   a feedback loop including a phototransistor for sensing output of said laser diode and an amplifier to compare laser diode output to a preselected value; and
   means for adjusting said energy source to provide input to said laser diode to produce an output proportional to said preselected value.

17. The microcavity light emitting semiconductor device of claim 15, wherein said microcavity light emitting semiconductor device comprises a vertical cavity surface emitting laser.

18. The microcavity light emitting semiconductor device of claim 15, wherein said microcavity light emitting semiconductor device comprises a resonant cavity light emitting diode.

19. The microcavity light emitting semiconductor device of claim 15, said first and second reflecting mirrors comprising distributed Bragg reflector mirrors being epitaxially formed comprising a plurality of semiconductor layers of alternating high and low indices of refraction, each layer having a thickness of $\lambda/4$.

20. The microcavity light emitting semiconductor device of claim 15, said semiconductor layers of low indices of refraction consisting of $Al_{0.9}Ga_{0.01}As$ and layers of high indices of refraction consisting of $Al_{0.3}Ga_{0.7}As$.

* * * * *